(12) United States Patent
Varnica et al.

(10) Patent No.: US 8,869,000 B2
(45) Date of Patent: Oct. 21, 2014

(54) METHODS AND SYSTEMS FOR EFFICIENT DECODING OF CONCATENATED ERROR CORRECTION CODES

(75) Inventors: Nedeljko Varnica, San Jose, CA (US);
Xueshi Yang, Cupertino, CA (US);
Sashi Kiran Chilappagari, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 293 days.

(21) Appl. No.: 13/359,705

(22) Filed: Jan. 27, 2012

(65) Prior Publication Data

US 2012/0198308 A1    Aug. 2, 2012

Related U.S. Application Data

(60) Provisional application No. 61/437,954, filed on Jan. 31, 2011.

(51) Int. Cl.
| | |
|---|---|
| *H03M 13/00* | (2006.01) |
| *H03M 13/37* | (2006.01) |
| *H03M 13/29* | (2006.01) |
| *H03M 13/11* | (2006.01) |
| *H03M 13/15* | (2006.01) |

(52) U.S. Cl.
CPC ...... *H03M 13/3707* (2013.01); *H03M 13/1108* (2013.01); *H03M 13/1111* (2013.01); *H03M 13/1515* (2013.01); *H03M 13/152* (2013.01); *H03M 13/29* (2013.01); *H03M 13/2906* (2013.01); *H03M 13/2951* (2013.01); *H03M 13/2966* (2013.01); *H03M 13/2975* (2013.01)
USPC .......................................... 714/755; 714/780

(58) Field of Classification Search
CPC .................................................. H03M 13/2951
USPC ........................... 714/755, 780; 365/262, 341
See application file for complete search history.

(56) References Cited

U.S. PATENT DOCUMENTS

| | | | | |
|---|---|---|---|---|
| 6,888,901 | B2 * | 5/2005 | Yu et al. ........................ | 375/341 |
| 7,260,762 | B2 * | 8/2007 | Desai et al. ................... | 714/755 |
| 7,765,453 | B2 * | 7/2010 | Duggan ........................ | 714/755 |
| 8,151,162 | B2 * | 4/2012 | Kanaoka et al. .............. | 714/755 |
| 8,230,304 | B2 * | 7/2012 | Bass ............................. | 714/774 |
| 8,352,840 | B2 * | 1/2013 | Crozier et al. ................ | 714/780 |
| 8,358,685 | B2 * | 1/2013 | Siti et al. ...................... | 375/233 |
| 8,537,919 | B2 * | 9/2013 | Fonseka et al. .............. | 375/265 |
| 8,566,678 | B2 * | 10/2013 | Eidson et al. ................. | 714/780 |

* cited by examiner

*Primary Examiner* — Esaw Abraham

(57) ABSTRACT

Decoding data received includes decoding the received data using a first error correcting circuitry that decodes data in accordance with a first decoding process, terminating execution of the first decoding process used to correct the data before the first error correcting circuitry completes executing the first, decoding process and outputting partially decoded data, determining whether partially decoded data requires further decoding, and in response to determining whether partially decoded data requires further decoding, decoding the partially decoded data using a second error correcting circuitry that decodes data in accordance with a second decoding process. A system decodes data in accordance with the method.

18 Claims, 4 Drawing Sheets

400

METHODS AND SYSTEMS FOR EFFICIENT DECODING OF CONCATENATED ERROR CORRECTION CODES

CROSS-REFERENCE TO RELATED APPLICATION

This application claims the benefit under 35 U.S.C. §119(e) of U.S. Provisional Application No. 61/437,954 filed Jan. 31, 2011, which is hereby incorporated by reference herein in its entirety.

FIELD OF USE

The present disclosure relates generally to communications or storage systems and methods, and more particularly, to systems and methods for decoding concatenated error correction codes.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

To improve the reliability of communications and storage systems, error correcting codes (ECC) are commonly applied to the data that is conveyed or stored, which adds redundancy to the data stream. To increase the error correcting capabilities, multiple error correcting codes may be concatenated one after another. In many situations, two error correcting codes are concatenated together: an inner code and outer code. The inner code is responsible for correcting a majority of the errors, while the outer code is responsible for correcting the relatively few remaining errors which the inner code did not correct.

In order to correct a majority of the errors, the inner decoder utilizes a stronger code than the outer decoder. The stronger code used by the inner decoder requires more resources, like energy and time, to complete correction. After the inner decoder completes its decoding operation, the completed decoded result, is provided to the outer decoder. The completed decoded result may contain additional errors which the inner decoder was not able to correct during its complete decoding process. The outer decoder is capable of correcting additional errors that the inner code was not able to correct. After the outer decoder completes, the final decoded result is provided.

As described above, concatenating multiple error correcting codes needs more redundancy in the data stream which allows for greater number of errors to be corrected. However, typical concatenated error correcting code decoder systems may consume large amounts of resources in order to achieve the high level of error correction capability.

SUMMARY OF THE DISCLOSURE

In accordance with one embodiment, there is provided a method for decoding data. The method includes receiving data to be decoded, decoding the received data using a first error correcting circuitry that decodes data in accordance with a first decoding process, terminating execution of the first decoding process used to correct the data before the first error correcting circuitry completes executing the first decoding process and outputting partially decoded data, determining whether partially decoded data requires further decoding, and in response to determining, decoding the partially decoded data using second error correcting circuitry that decodes data in accordance with a second decoding process.

In accordance with another embodiment, in the foregoing method terminating execution of the first decoding process includes deriving a decoder error metric, comparing the decoder error metric with a stopping rule, determining whether the decoder error metric has met the stopping rule, and terminating execution of the first, decoding process before the first decoding process is completed in response to determining the decoder error metric has met the stopping rule.

In accordance with a third embodiment, in the foregoing method terminating execution of the first decoding process includes determining whether a pre-determined time event has occurred, the pre-determined time event comprises a time unit of the first error correction circuitry, wherein the time unit is a clock cycle or an iteration of an iterative decoder.

In accordance with a fourth embodiment, in the foregoing method determining whether the partially decoded data requires further decoding includes determining whether a decoder error metric indicates a divergence.

In accordance with a fifth embodiment, a system for decoding data. The system includes error correcting circuitry configured to decode received data in accordance with a first decoding process. The error correcting circuitry is configured to terminate the execution of the first decoding process used to correct the data before the first decoding process is completed and output partially decoded data, determine whether the partially decoded data requires further decoding, and decode the partially decoded data in accordance with a second decoding process in response to determining whether the partially decoded data requires further decoding.

In accordance with a sixth embodiment, the error correcting circuitry includes an iterative decoder.

In accordance with a seventh embodiment, the error correction circuitry is further configured to derive a decoder error metric, compare the decoder error metric with a stopping rule, determine whether the decoder error metric has met the stopping rule, and terminate execution of the first decoding process before the first decoding process is completed in response to determining the decoder error metric has met the stopping rule.

In accordance with an eighth embodiment, the error correcting circuitry is further configured to determine a number of bits flipped in the first decoding process in a pre-determined time interval.

In accordance with a ninth embodiment, the error correcting circuitry is further configured to determine whether a pre-determined time event has occurred, the pre-determined time event includes a time unit of the error correction circuitry. The time unit is a clock cycle or an iteration of the first decoding process.

In accordance with a tenth embodiment, the error correcting circuitry is further configured to determine whether a decoder error metric indicates a divergence.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the disclosure, certain illustrative embodiments will now be described. However, the systems and methods described herein may be adapted and modified as is appropriate for the application being addressed and the systems and methods described herein may be employed in other suitable applications, and such other additions and modifications will not depart from the scope hereof.

Figure 1:
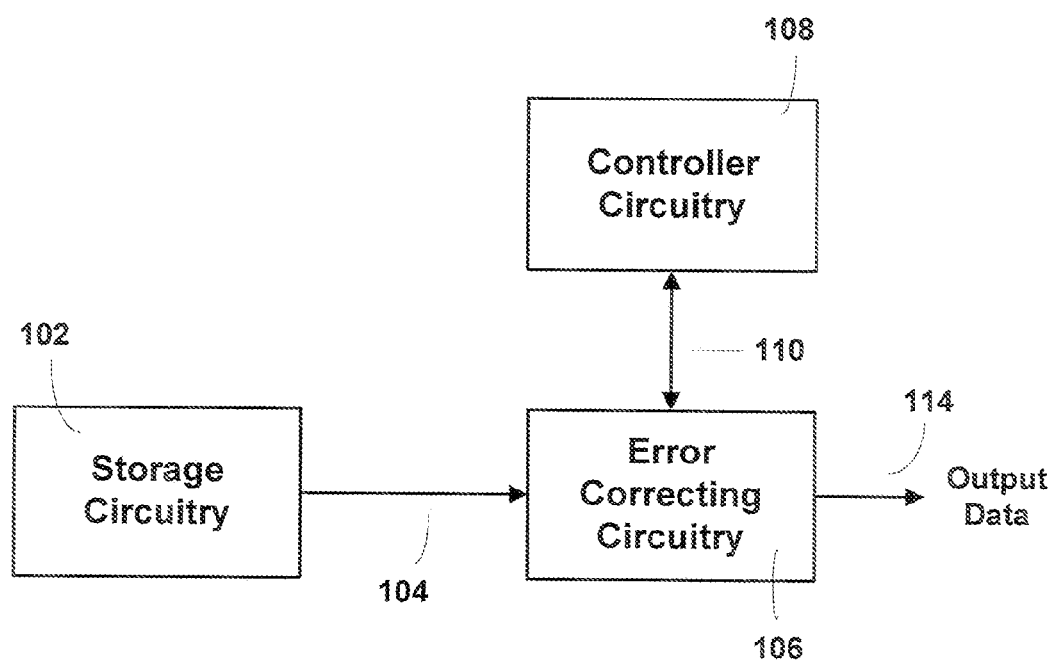
FIG. 1 shows an example of a storage system according to an embodiment of the present disclosure.

FIG. 1 shows an example of a storage system 100 according to an embodiment of the present disclosure. System 100 may be used to transfer the received data 104 from the storage circuitry 102 to the error correcting circuitry 106. After error correcting circuitry 106 processes received data 104 to produce decoded output data, the decoded output data is provided to the output 114. The controller circuitry 108 provides the controller signals 110 to error correcting circuitry 106, which configures and controls the operation of error correcting circuitry 106. Controller signals 110 may be communicated from error correcting circuitry 106 to controller circuitry 108, in order for controller circuitry 108 to decide the processes which error correcting circuitry 106 should operate with and to determine the configuration and control signals 110 to provide to error correcting circuitry 106.

Storage circuitry 102 may represent any suitable storage medium in which received data 104 is stored, such as a magnetic storage device (e.g., a hard disk), an electrical storage device (e.g., FLASH ROM). In some embodiments, storage circuitry 102 may represent a flash memory system. Alternatively, storage circuitry 102 may represent any suitable wired or wireless transmission medium through which received data 104 is conveyed. The transmission or the storage medium within storage circuitry 102 may cause received data 104 to be affected by signal-depend or signal-independent noise and/or interference. This noise may create errors in received data 104. To correct errors that may exist in received data 104, received data 104 is decoded by error correcting circuitry 106.

Received data 104 may be transferred from storage circuitry 102 to error correction circuitry 106 using one or more data-carrying signals. The data-carrying signals may be transferred through a transmission or storage medium within storage circuitry 102 that may degrade the signal.

Error correcting circuitry 106 receives received data 104 from storage circuitry 102. As previously described, noise and/or interference introduced to the encoded data, by or received at storage circuitry 102, may create errors in received data 104. Error correcting circuitry 106 tries to decode the data in view of these errors.

Figure 2:
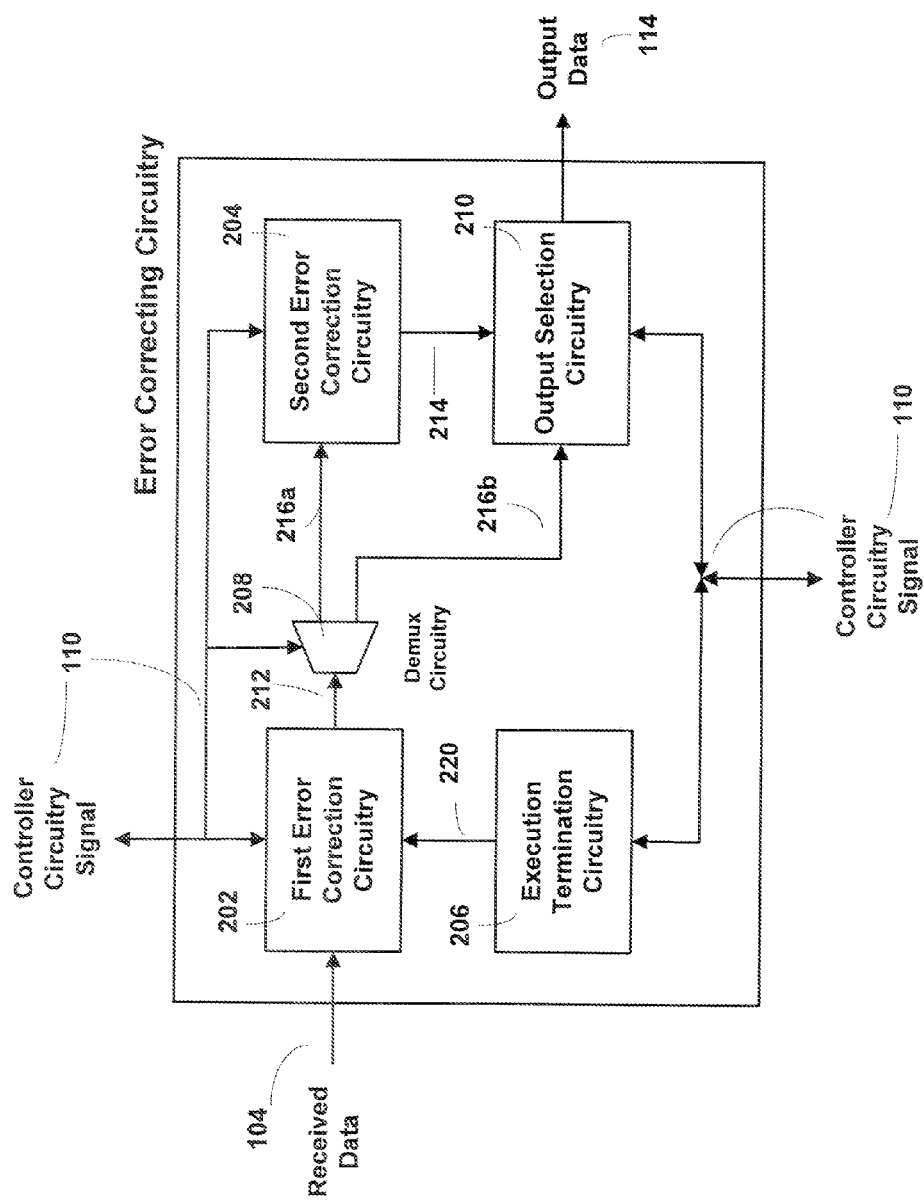
FIG. 2 shows an example of an error correcting circuitry according to an embodiment of the present disclosure.

FIG. 2 shows example of an error correcting circuitry 106 according to an embodiment of the present disclosure. Error correcting circuitry 106 receives received data 104 and processes the data in order to correct errors that may exist. Configuration and control signals 110 received from controller circuitry 108 are used to configure and control the operation of error correcting circuitry 106.

In some embodiments, error correcting circuitry 106 may use a concatenated coding scheme where multiple error correction codes are used. FIG. 2 shows a concatenated coding scheme comprising a first error correction circuitry 202 and a second error correction circuitry 204. First error correction circuitry 202 and second error correction circuitry 204 may use the same, similar or different decoding techniques. In certain embodiments, first error correction circuitry 202 is responsible for removing a majority of the errors in received data 104, such that, second error correction circuitry 204 receives relatively few errors which may be corrected and provided to output 114. First error correction circuitry 202 may consume more power to perform its decoding process compared to second error correction circuitry 204.

In certain embodiments, first error correcting circuitry 202 may be implemented as an iterative decoder, such as an LDPC decoder or Turbo decoder. Examples of LDPC decoders are hard-decoders, such as bit-flipping decoders, or soft decoders, such as log-likelihood based decoders. Iterative decoders allow multiple iterations of the decoding process to occur over received data 104. Each iteration attempts to improve the error correction performed by previous error correction iterations. In some embodiments, first error circuitry 202 may be implemented as any error correction decoder which allows the decoding process to terminate before completion and may provide a partially decoded output.

In certain embodiments, second error correcting circuitry 204 may be based on algebraic codes to produce an output using a hard decoding mode. Examples of these types of codes are Reed-Solomon or BCH codes. As previously mentioned, second error correcting circuitry 204 may be configured to correct relatively fewer errors than first error correcting circuitry 202, allowing second error correcting circuitry 204 to have a shorter average decoding time and consume less power than first error correction circuitry 202.

In certain embodiments, first error correction circuitry 202 processes received data 104 to produce a first decoded output 212. Based on certain stopping rules, the execution termination circuitry 206 may be directed by controller circuitry 108 to produce the termination signals 220. Stopping rules may be pre-defined rules which indicate to first error correction circuitry 202 that further error correcting is not required. If first error correction circuitry 202 receives a signal to terminate from execution termination circuitry 206, controller circuitry 108 may direct first error correction circuitry 202 to prematurely terminate execution and produce a partially decoded output. If first error correction circuitry 202 completes, and does not terminate execution prematurely, fully decoded data is outputted.

After first error correction circuitry 202 terminates or completes, first decoded output 212 may be provided to the selection circuitry 208. Selection circuitry 208 may comprise MUXes, de-MUXes, switches, or any circuitry which allows an input to be routed to a selected output. Selection circuitry 208 is directed by controller circuitry 108 to select whether to provide the first decoded output 216b directly to the output selection circuitry 210 or provide the first decoded output 216a to second error correction circuitry 204. This selection may be based on the stopping rules. If first decoded output 216a is provided to second error correction circuitry 204, second error correction circuitry 204 decodes first decoded output 216a and corrects the errors that may be remaining. Second error correction circuitry 204 may then be directed by controller circuitry 108 to provide the second decoded output 214 to output selection circuitry 210. Based on the stopping rules, output selection circuitry 210 may be directed by controller circuitry 108 to provide to output 114 either first decoded output 216*b*, or, if second error correction circuitry's 204 decoding process was performed, second decoded output 214.

By allowing first error correction circuitry 202 to terminate early, power consumption and decode time by the first error correction circuitry may be reduced, and the remaining errors may be corrected by the lower power and faster second error correction circuitry 204. Since the majority of time and power is consumed by first error correction circuitry 202, by reducing the resources used by first error correction 202, total system power and decode time can be reduced.

Figure 3:
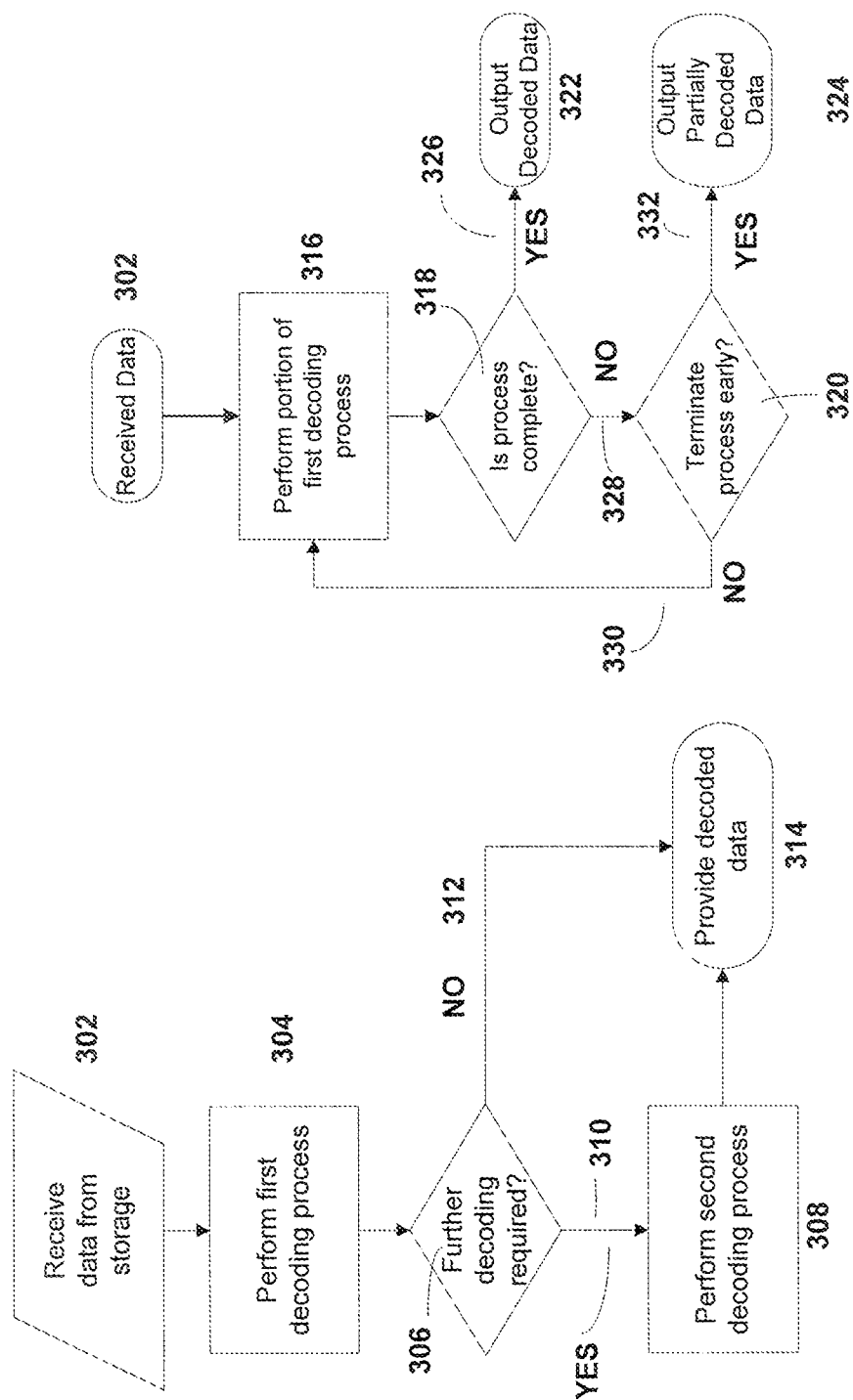
FIGS. 3A-3B show illustrative processes for decoding received data according to an embodiment of the present disclosure.
Figure 4:
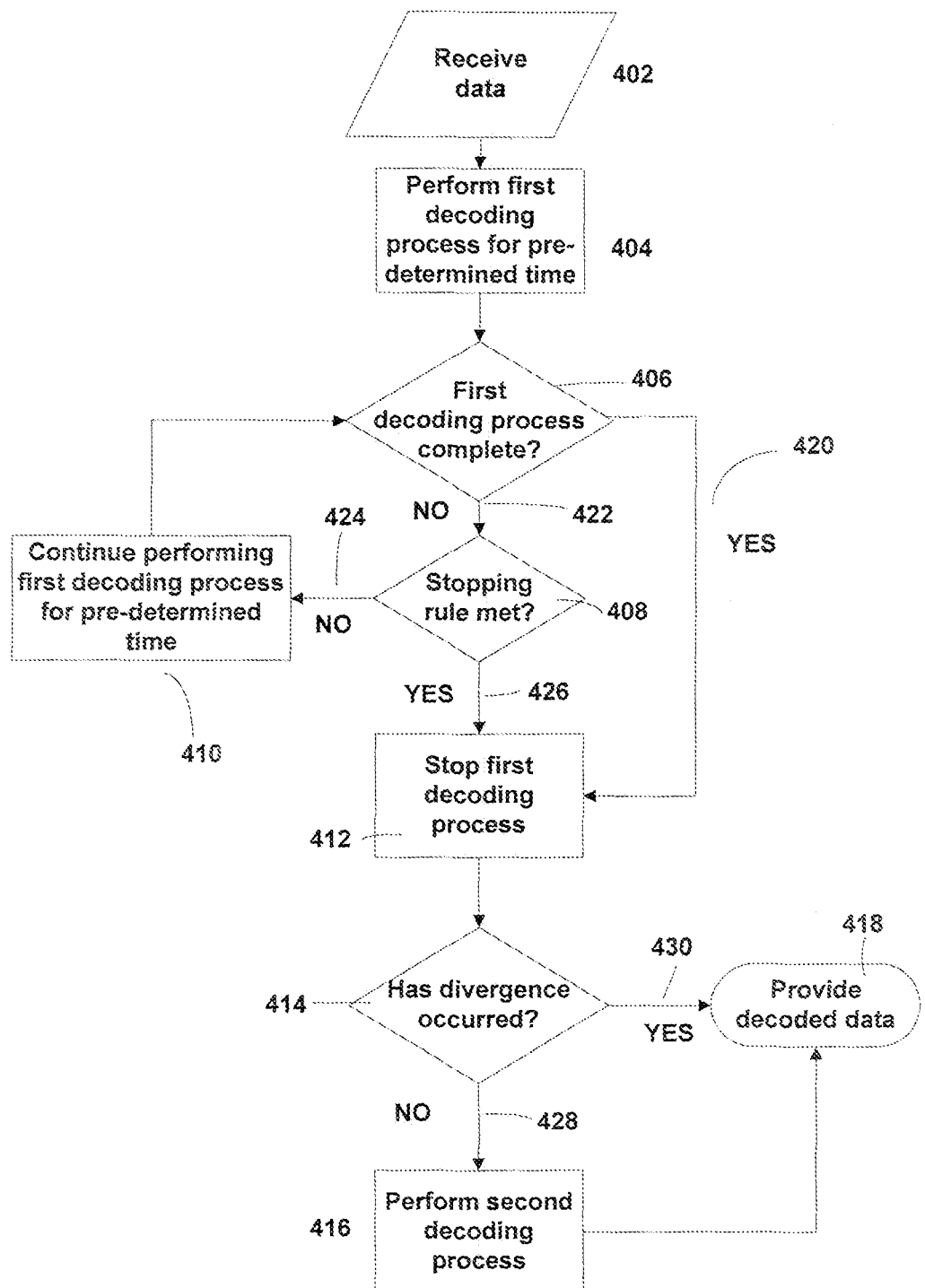
FIG. 4 shows an illustrative process for decoding received data according to another embodiment of the present disclosure.

The decoding processes within error correcting circuitry 106 is described in more detail in FIGS. 3A-3B and FIG. 4. These figures show the methods describing the interaction between the different circuitry, in particular the interaction between execution termination circuitry 206, first error correction circuitry 202, and second error correction circuitry 204 and how the stopping rules help controller circuitry 108 control and configure each circuitry.

FIGS. 3A-3B show illustrative processes 300 and 304 for decoding received data 104 according to an embodiment of the present disclosure. FIG. 3A describes the overall process performed by error correcting circuitry 106. At 302, error correcting circuitry 106 receives received data 104 from storage circuitry 102. At 304, first error correction circuitry 202 performs the first decoding process. After the first decoding process terminates, at 306, a decision is made by controller circuitry 108, whether further decoding is required. At 312, if no further decoding process is required, controller circuitry 108 directs selection circuitry 208 and output selection circuitry 210 to send first decoded output 212 to output 114, at 314. Otherwise, if further decoding is required, at 310, selection circuitry 208 is directed to send first decoded output 212 to second error correction circuitry 204, to perform a second decoding process, at 308. Once second error correction circuitry 204 completes, second decoded output 214, produced by second error correction circuitry 204, is delivered, at 314, to output 114 through output selection circuitry 210.

FIG. 3B discusses in more detail the method, 304, of processing the first decoding process using first error correction circuitry 202 and determining when during the first decoding process to terminate. At 302, after receiving received data 104, at 316, controller circuitry 108 directs first error correction circuitry 202 to perform a first decoding process. At 316, the first decoding process is performed until a pre-determined time event has occurred. The pre-determined time event may comprise a pre-determined unit of time, which may be clock cycles, iterations of an iterative decoder, or pre-determined stages of the first decoding process.

At 318, after a pre-determined unit of time has passed, controller circuitry 108 determines whether the first decoding process has completed. At 326, if the first decoding process has completed, then, at 322, controller circuitry 108 directs first error correction circuitry 202 to terminate the first decoding process and output the fully decoded data. At 328, if the first decoding process has not completed, then, at 320, controller circuitry 108 determines whether to prematurely terminate the first decoding process by sending termination signal 220 from execution terminating circuitry 206 to first error correction circuitry 202.

Controller circuitry 108 determines whether to terminate the first decoding process based on stopping rules. Stopping rules are pre-defined rules which indicate whether further decoding is required by first error correcting circuitry 202. For example, further decoding may not be required if controller circuitry 108 estimates that a computed number of errors remaining in the currently processed user data is very likely to be, equal to or less than a pre-defined error threshold. In certain embodiments, further decoding may not be required if controller circuitry 108 estimates that a computed number of errors remaining in the currently processed user data is equal to or less than a pre-defined error threshold. In another example, further decoding may not be required based on the comparison of a computed syndrome weight to pre-defined threshold values. The syndrome weight is a computed value, by first error correction circuitry 202, indicating the likelihood of errors remaining in the currently processed received data. Each of these computed values are reliability metrics indicating reliability of the currently processed received data.

At 330, if controller circuitry 108 determines that the first decoding process should not terminate early, at 316, the first decoding process continues processing until another pre-determined unit of time has elapsed. Otherwise, at 332, if controller circuitry 108 determines that the first decoding process should terminate early, at 324, the first decoding process is terminated and partially decoded data is outputted.

As mentioned previously, stopping rules indicate whether further processing using the first decoding process is required. Further decoding using the first decoding process may not be required if the number of errors within the currently processed received data is estimated to be low enough for second error correction circuitry 204 to correct. By using second error correction circuitry 204, total system power and total decoding time may be reduced.

Alternatively, further processing of the first decoding process may not be required if further progress is not made with respect to error correction. The change in the decoded data values between units of time may be used as an indicator whether the first decoding process is progressing.

Additionally, the number of changes made in the user data between different units of time may also indicate whether progress is being made in the first decoding process. Rather than determining whether errors have been corrected, controller circuitry 108 may calculate the number of changes within the user data. Little or no change may indicate that the first decoding process has stalled. Large changes in the user data may indicate that the first decoding process has failed and further decoding may increase the number of errors. Terminating the first decoding process when it is determined that progress is not being made with respect to error correction may save decoding power and reduces decoding time, since little or no progress would be made with additional, usage of first error correction circuitry 202.

Each of the methods for terminating execution of the first decoding process may be used individually or combined together.

In certain embodiments, the methods for determining that the number of errors within the currently processed received data is low may include determining whether a syndrome weight is below a pre-defined threshold. The syndrome weight of the decoding process may indicate the likelihood of errors remaining in the processed received data. The syndrome weight is calculated by the first decoding process of first error correction circuitry 202. The syndrome weight calculation may be updated frequently based on a pre-determined unit of time or whenever further processing of first decoding process is being determined by controller circuitry 108.

A low syndrome weight may indicate that few errors remain in the user data. A low syndrome weight may also be used to indicate that a trapping state has been reached. When the number of errors remaining in the user data is low, a trapping state may occur where no more errors may be corrected. When in a trapping state, performing further decoding of the user data using the first decoding process may not lead to more errors corrected. By identifying that the syndrome weight is below a certain threshold, trapping states may be avoided, preventing wasted processing from occurring, since more errors may not be corrected.

In order to reduce power consumption and improve decoding time, controller circuitry 108 may direct first error correction circuitry 202 to terminate the first decoding process early and direct second error correction circuitry 204 to attempt to correct the rest of the remaining errors. If the syndrome weight indicates no-errors exists, controller circuitry 108 may direct error correction circuitry 106 to skip the second decoding process of second error correction circuitry 204. Multiple pre-defined thresholds may be used by controller circuitry 108 to determine whether to prematurely terminate the first decoding process. Then controller circuitry 108 may direct second error correction circuitry 204 to perform further processing using the second decoding process, or direct selection circuitry 208 and output selection circuitry 210 to provide decoded output 212 of first error correction circuitry 202 to output 114.

In certain embodiments, the methods for determining that the number of errors within the currently processed user data is not decreasing may include determining whether the syndrome weight is above a pre-defined threshold. As previously mentioned, syndrome weight may indicate the likelihood of errors remaining in the processed user data. A large syndrome weight may indicate that the number of errors remaining is high. The number of errors may be too large for the first decoding process of first error correction circuitry 202 to correct. Further processing of the user data may not provide any improvement to the error correcting process, and may only consume power and time. In cases where the number of errors may be large, the system may resort to alternative methods to correct these errors, i.e., retry and retransmit mechanisms within storage circuitry 102. By controller circuitry 108 determining whether the syndrome weight exceeds a pre-defined threshold, the first decoding process may terminate without wasting power and time.

Alternatively, controller circuitry 108 may compare the change in syndrome weight across multiple pre-determined units of time. A decrease in syndrome weight may indicate that error correction progress is being made and that the first decoding process may be able to correct the errors. Conversely, an increase in syndrome weight may indicate that the decoding process is introducing more errors rather than correcting them. By comparing across multiple units of time, controller circuitry 108 may determine whether further decoding may be beneficial.

In certain embodiments, the methods for determining whether the first decoding process is providing changes to the decoded data may include determining in a given pre-determined unit of time the number of bits or symbols that change values, the number of bits flipped, or the change in likelihood of the bits of the processed received data. Controller circuitry 108 may evaluate the progress of the first decoding process by comparing the change in decoded data with a pre-determined threshold value. A small change between subsequent units of time may indicate that the first decoding process is not progressing. If little or no changes occur, the first decoding process may be at a steady state, where additional errors may not be corrected. To prevent wasted power and reduce decoding time, controller circuitry 108 may direct execution termination circuitry 206 to send terminating signals 220 to first error correction circuitry 202 to terminate early when steady state is determined.

Alternatively, a very large change between subsequent units of time may also indicate that the first decoding process is not progressing in the right direction. For example, if first correction circuitry is configured to correct up to 100 errors, and 200 bits are flipped in a given unit of time, decoding process may have failed, and further progress will not be achieved. In this situation, early termination of the decoding process prevents further waste of power and decoding time. Comparing, for a given pre-determined unit of time, the number of bits/symbols that change values (e.g. the number of bits flipped) to pre-defined threshold values, allows controller circuitry 108 to determine whether further progress can be achieved.

In certain embodiments, the methods for determining that the first decoding process may not require further processing may be based on log-likelihood ratios (LLRs). First error correction circuitry 202 may calculate log-likelihood ratio (LLR) metrics to indicate the likelihood of a bit of the decoded or received data being a 1 or 0. A large number of bits having a high likelihood of either being a 1 or 0 may indicate that the number of errors remaining is low. When the number of errors remaining is low, controller circuitry 108 may direct execution terminating circuitry 206 to send a termination signal 220 to first error correction circuitry 202 to terminate execution and then direct second error correcting circuitry 204 to correct the remaining errors.

Alternatively, a large number of bits having a low likelihood of either being a 1 or 0 may indicate that the number of errors remaining is high. Little or no improvement of the likelihoods after subsequent units of time may indicate that the first decoding process has failed and no progress may be achieved. In this situation, early termination of the decoding process prevents further waste of power and decoding time. Comparing for a given pre-determined unit of time, the change in the LLR metrics, allows controller circuitry 108 to determine whether further progress may be achieved.

FIG. 4 shows an illustrative process 400 for decoding received data according to another embodiment of the present disclosure. At 402, received data is received by error correcting circuitry 106 from storage circuitry 102. Received data 104 is provided to first error correction circuitry 202, and, at 404, the first decoding process is performed. After a pre-determined unit of time has elapsed, at 406, controller circuitry 108 determines whether the first decoding process of first error correction circuitry 202 has completed. At 422, if the first decoding process has not completed, at 408, controller circuitry 108 determines whether a stopping rules has been met. Otherwise, at 420, if the first decoding process has completed, at 412, the first error correction circuitry 202 has already terminated the first decoding process.

As discussed previously, at 408, determining whether the stopping rule has been met includes comparing by controller circuitry 108 a computed decoder error metric, computed by first error correction circuitry 202, with the stopping rule. The decoder error metric may include reliability metrics. The stopping rule may comprise a pre-defined threshold value and the reliability metrics may include a computed value of the number of bits/symbols that changed or flipped, the change in LLR, the syndrome weight, or the change in syndrome weight over a pre-determined unit of time.

At 424, if a stopping rule has not been met, then, at 410, controller circuitry 108 directs first error correction circuitry 202 to continue the first decoding process for another pre-determined unit of time. At 426, if a stopping rule has been met, then, at 412, controller circuitry 108 directs execution termination circuitry 206 to send a termination signal to first error correction circuitry 202 to terminate the first decoding process early.

After the first decoding process has terminated, at 414, controller circuitry 108 determines whether divergence has occurred during the first decoding process. Divergence indicates that the number of remaining errors in the decoded output data would not be reduced by further decoding. Divergence determination by controller circuitry 108 may include analyzing the stopping rule to determine if the first decoding process has failed with a large number of errors and remaining errors cannot be corrected. At 430, if divergence has occurred, at 418, controller circuitry 108 may direct selection circuitry 208 and output selection circuitry 210 to deliver the decoded outputted data 212 produced by first error correction circuitry 202 to output 114. Otherwise, at 428, if divergence has not occurred, at 416, decoded outputted data 212 is provided to second error correction circuitry 204 to perform a second decoding process. After the second decoding process completes, at 418, controller circuitry 108 directs second error correction circuitry 204 and output selection circuitry 210 to provide the result to output 114.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for decoding data, the method comprising:
   receiving data to be decoded;
   decoding the received data using first error correcting circuitry that decodes data in accordance with a first iterative decoding process;
   terminating execution of the first iterative decoding process used to correct the data before the first error correcting circuitry completes executing the first iterative decoding process;
   producing partially decoded intermediate data in response to the terminating, the partially decoded intermediate data resulting from the terminated first iterative decoding process;
   determining whether the partially decoded intermediate data requires further decoding by determining whether the first iterative decoding process has failed; and
   in response to determining that the first iterative decoding process has not failed, decoding the partially decoded intermediate data using second error correcting circuitry that decodes data in accordance with a second decoding process.

2. The method of claim 1, wherein terminating execution of the first decoding process comprises:
   deriving a decoder error metric;
   comparing the decoder error metric with a stopping rule;
   determining whether the decoder error metric has met the stopping rule; and
   terminating execution of the first decoding process before the first decoding process is completed in response to determining the decoder error metric has met the stopping rule.

3. The method of claim 2, wherein decoding the received data further comprises calculating a reliability metric of intermediate results of the first decoding process.

4. The method of claim 2, wherein the decoder error metric comprises a reliability metric.

5. The method of claim 4, wherein the reliability metric comprises a syndrome weight or an overall LLR metric.

6. The method of claim 1, wherein decoding the received data comprises determining a number of bits flipped in the first decoding process in a pre-determined time interval.

7. The method of claim 1, wherein terminating execution of the first decoding process comprises determining whether a pre-determined time event has occurred, the pre-determined time event comprises a time unit of the first error correction circuitry, wherein the time unit is a clock cycle or an iteration of an iterative decoder.

8. The method of claim 1, wherein determining whether the partially decoded data requires further decoding, further comprises:
   determining whether a decoder error metric indicates a divergence.

9. The method of claim 1, wherein whether to decode the partially decoded data using a second error correcting circuitry depends on whether the decoder error metric has indicated a divergence.

10. A system for decoding data, comprising:
    error correcting circuitry configured to decode received data in accordance with a first iterative decoding process, wherein the error correcting circuitry is configured to:
    terminate the execution of the first iterative decoding process used to correct the data before the first iterative decoding process is completed;
    produce partially decoded intermediate data in response to terminating the execution, the partially decoded intermediate data resulting from the terminated first iterative decoding process;
    determine whether the partially decoded intermediate data requires further decoding by determining whether the first iterative decoding process has failed; and
    decode the partially decoded intermediate data in accordance with a second decoding process in response to determining that the first iterative decoding process has not failed.

11. The system of claim 10, wherein the error correction circuitry is further configured to:
    derive a decoder error metric;
    compare the decoder error metric with a stopping rule;
    determine whether the decoder error metric has met the stopping rule; and
    terminate execution of the first decoding process before the first decoding process is completed in response to determining the decoder error metric has met the stopping rule.

12. The system of claim 11, wherein the error correction circuitry is further configured to calculate a reliability metric of intermediate results of the first decoding process.

13. The system of claim 11, wherein the decoder error metric comprises a reliability metric.

14. The system of claim 13, wherein the reliability metric comprises a syndrome weight or an overall LLR metric.

15. The system of claim 10, wherein the error correcting circuitry is further configured to determine a number of bits flipped in the first decoding process in a pre-determined time interval.

16. The system of claim 10, wherein the error correcting circuitry is further configured to determine whether a pre-determined time event has occurred, the pre-determined time event comprises a time unit of the error correction circuitry, wherein the time unit is a clock cycle or an iteration of the first decoding process.

17. The system of claim 10, wherein the error correcting circuitry is further configured to determine whether a decoder error metric indicates a divergence.

18. The system of claim 10, wherein the error correcting circuitry is further configured to determine whether to decode the partially decoded data using a second decoding process depending on whether the decoder error metric has indicated a divergence.

* * * * *